United States Patent [19]

Schuermeyer

[11] 4,450,369
[45] May 22, 1984

[54] DYNAMIC MESFET LOGIC WITH VOLTAGE LEVEL SHIFT CIRCUIT

[76] Inventor: Fritz L. Schuermeyer, 1759 Southview Dr., Yellow Springs, Ohio 45433

[21] Appl. No.: 261,358

[22] Filed: May 7, 1981

[51] Int. Cl.³ .................. H03K 19/094; H03K 19/20; H03K 23/08
[52] U.S. Cl. ................................ 307/450; 307/475; 377/121; 377/117
[58] Field of Search ............... 307/443, 446, 475, 264; 377/105, 117, 121

[56] References Cited

U.S. PATENT DOCUMENTS

| | | | |
|---|---|---|---|
| 3,986,044 | 10/1976 | Madland et al. | 307/205 |
| 4,035,662 | 7/1977 | Kuo | 307/205 |
| 4,065,679 | 12/1977 | Heeren | 307/251 |
| 4,109,163 | 8/1978 | Cricchi et al. | 307/475 |

OTHER PUBLICATIONS

Livingstone et al., "Capacitor Coupling of GaAs Depletion-Mode FETs", *IEE Proc.*, vol. 127, Pt. I, No. 5; pp. 297–300; 10/1980.
Van Tuyl et al., "GaAs MESFET Logic with 4-GHz Clock Rate", *IEEE Journal of Solid-State Circuits*, vol. SC-12, No. 5; pp. 485–496; 10/1977.
Nuzillat et al., *IEEE Proc.*, vol. 127, Pt. I, No. 5, pp. 287–296; 10/1980.
Dreyfack, "Gallium Arsenide to Yield 5-GHz Divider", *Electronics;* pp. 76 & 78; 10/9/1980.
IBM Technical Disclosure Bulletin, vol. 17, No. 5, Oct. 1974.
IBM Technical Disclosure Bulletin, vol. 21, No. 2, Jul. 1978.
IBM Technical Disclosure Bulletin, vol. 21, No. 12, May 1979.
R. L. Van Tuyl & C. A. Liechti, High Speed GaAs MSI, Digest of Technical Papers, IEEE Inter. Solid State Circuits Conf., Paper WAM1.5.
G. Gibbons, Solid State Faces New Questions, MSN9, (Microwave Systems News Journal, vol. 9, No. 13), Dec. 1979.

*Primary Examiner*—Larry N. Anagnos
*Attorney, Agent, or Firm*—Donald J. Singer; Bernard E. Franz

[57] ABSTRACT

GaAs digital electronics uses mainly depletion mode MESFET technology. In typical circuits, negative voltage logic input signals are required while the output voltage is positive. To connect gates, level shifters are needed to shift the positive voltage output signals such that they become suitable for the input to the next gate. A capacitor is used which performs the level shifting. As the charge leaks off the capacitor, the voltage level has to be readjusted periodically, leading to a "dynamic" circuit. A method for self-biasing of the capacitor for readjustment of the voltage level is taught.

5 Claims, 11 Drawing Figures $Z = (\overline{A} + R)(\overline{B} + C)$ $\overline{Z} = A\overline{R} + BC$ $Z = \overline{A}(\overline{B} + \overline{C})$ $\overline{Z} = A + BC$

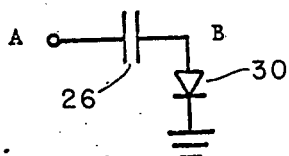
Fig. 2A
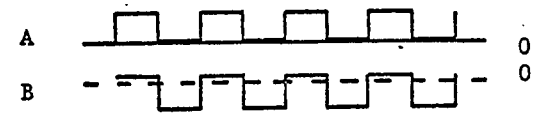
Fig. 2B
Fig. 5 PRIOR ART
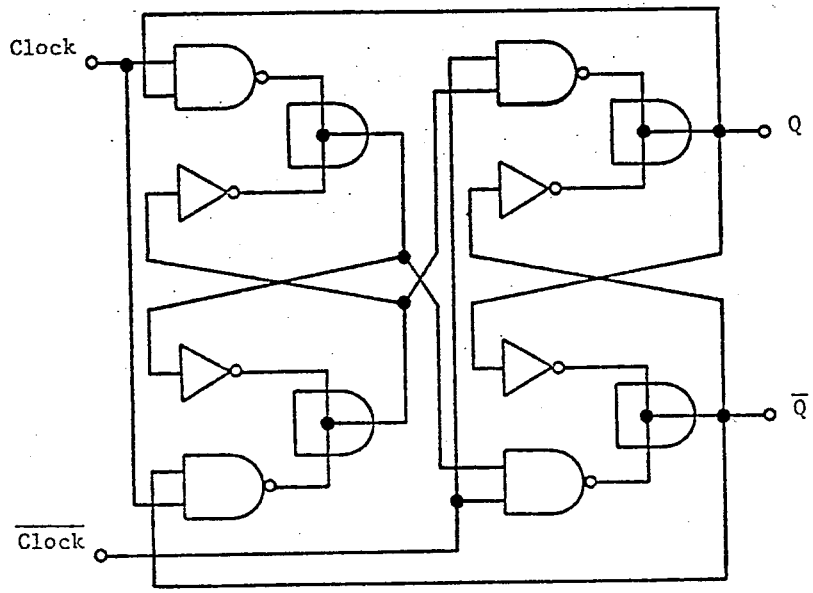
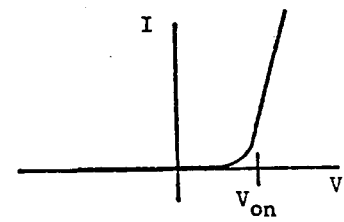
Fig. 3
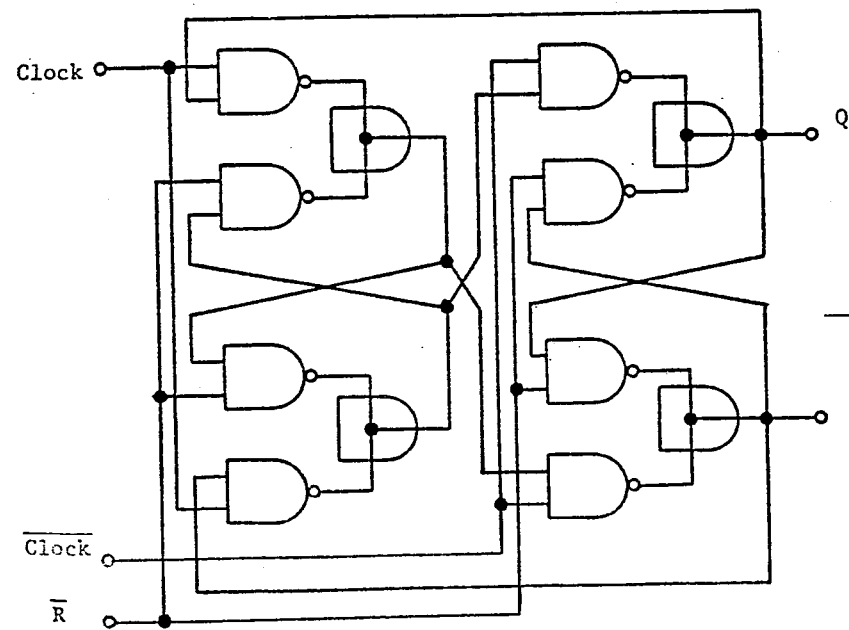
Fig. 7

DYNAMIC MESFET LOGIC WITH VOLTAGE LEVEL SHIFT CIRCUIT

RIGHTS OF THE GOVERNMENT

The invention described herein may be manufactured and used by or for the Government of the United States for all governmental purposes without the payment of any royalty.

BACKGROUND OF THE INVENTION

This invention relates to MESFET logic which includes voltage level shift circuits.

MESFET (metal-semiconductor field effect transistor) technology is becoming of importance both for Si (silicon) and GaAs (gallium arsenide) technology. GaAs digital electronics uses mainly depletion mode MESFET technology. In typical circuits negative voltage logic input signals are required while the output voltage is positive. To connect gates, level shifters are needed to shift the positive voltage output signals such that they become suitable for the input to the next gate. Commonly, a string of Schottky diodes in connection with a current source is used for this level shifting function. The level shifting circuit uses GaAs surface area, consumes power, requires often a separate power supply and adds to the delay of the circuit.

Capacitors have been used for level shifting for many years, and were even commonly used in tube type amplifiers. For example, U.S. Pat. No. 4,035,662 discloses a circuit which uses capacitors for shifting voltage levels in insulated gate field-effect-transistor inverter-type circuits. U.S. Pat. No. 4,109,163 is for a high speed radiation hard complimentary MOS capacitive voltage level shift circuit. IBM Bulletin Vol. 17, No. 5, October 1974, shows a circuit for capacitively stabilizing a substrate voltage. IBM Bulletin, Vol. 21, No. 2, July 1978, discloses a circuit which includes capacitors for shifting voltage levels. However, it should be noted that each type of semiconductor technology presents its own problems requiring solution.

SUMMARY OF THE INVENTION

An object of this invention is to help meet the need for electronic circuits with improved performance and density. A specific object is to reduce the surface area used, to minimize the circuit delay, and to help solve power supply problems, in integrated circuit technology.

According to the invention, a capacitor is connected between a MESFET inverting logic stage and the Shottky barrier input of the next MESFET stage. The capacitor is self-biased by the logic signals. The logic operational frequency must be sufficiently high to make the period between level changes very short compared to the capacitor discharge time.

BRIEF DESCRIPTION OF THE DRAWING

FIG. 2A is a schematic representation of a level shifter with input to a Schottky diode representing input to the next gate;

FIG. 2B is a graph showing signals at nodes A and B of FIG. 2A, indicating the level shifting;

FIG. 3 is a graph showing Schottky diode I-V characteristics ($V_{on}$ is typically 0.4 volts);

FIG. 5 is a functional block logic diagram of a frequency divider, in which the binary divider is composed of four MESFET logic circuits as shown in FIG. 4;

FIG. 7 is a functional block diagram of a frequency divider, using dynamic MESFET logic of FIG. 6, where R is used to initiate the circuit or for reset.

DETAILED DESCRIPTION

Figure 1A:
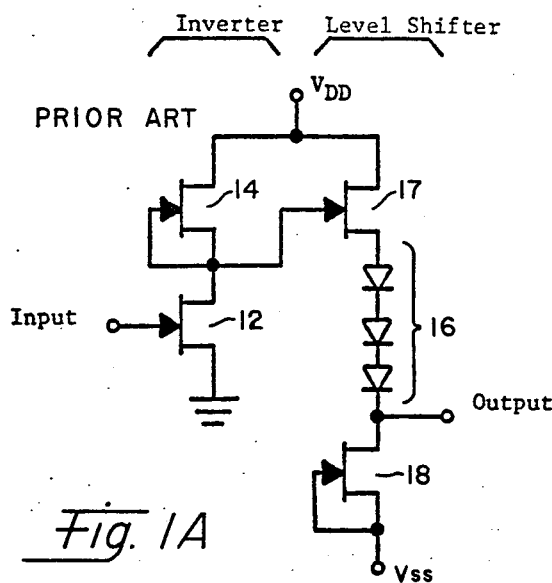
FIG. 1A is a typical prior art GaAs MESFET inverter with Schottky diode level shifter.

A typical prior art inverter stage, using GaAs depletion mode MESFET technology and Schottky diodes for level shifting is shown in FIG. 1A. The inverter comprises an active transistor 12 and a load transistor 14. The associated level shifter comprises a string of Schottky diodes 16 as well as two transistors 17, 18 and a connection to a special voltage source Vss. Transistor 17 is a source follower and 18 provides a constant current source. The output is shown connected to the gate of an FET transistor 19 of the next stage, which includes a Shottky barrier.

Figure 1B:
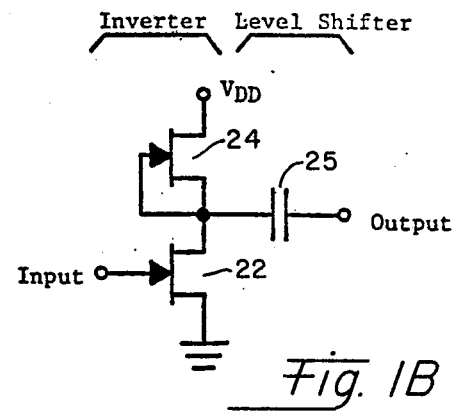
FIG. 1B is an inverter cell with capacitor level shifter according to the invention.

The level shifter according to the invention is shown in FIG. 1B, using a capacitor for level shifting. The dc level of the output adjusts itself to the correct dc level when the output is connected to the gate of a MESFET where the source is typically at ground potential and when the input is cycled. The inverter comprises an active transistor 22 and a load transistor 24 as in FIG. 1A, but the level shifter is simply a capacitor 25. The output is shown connected to the gate of an FET transistor 29 of the next stage, which includes a Schottky barrier.

Since the gate of a MESFET can be represented by a Schottky diode 30, the level shifter connected to the gate of a transistor can be represented by the circuit shown in FIG. 2A. When a signal, e.g., a square wave signal, is applied to node A, a level shifted signal on node B results, as shown by the graph of FIG. 2B. The positive swing of this signal on node B is limited by the forward characteristics of the diode. This signal shift can be best explained considering the I-V characteristics of the Schottky diode (FIG. 3). The leakage charge encountered during the negative part of the signal must be compensated by the leakage charge encountered during the positive part of the signal. Since the leakage current is very small in the reverse direction, the positive voltage swing will be below the voltage where strong conduction is encountered. Hence, the positive part of the signal will be only slightly positive. Due to the leakage currents, the signals at B are not constant but decay with time towards the zero potential (assuming good isolation of the capacitor). Since the positive signal is close to the zero potential, little change of the positive potential with time occurs. However, the negative signal is affected by the leakage currents and decays to zero potential. To achieve proper level shifting self-biased, the period of the signal must be insignificant relative to the discharging time. The disclosed capacitor levels obtained at B are identical to the signal levels required for operation of a MESFET.

The capacitor level shifter can be used not only where the next stage uses a single gate MESFET but also where a multigate transistor is used providing the gate can be represented by a diode (FIG. 2A) such as the gate closest to source. When using capacitor level shifters, care must be taken that the node A of every gate (FIG. 2A) can be put or will go by itself into the high voltage level during power up and at time intervals which are sufficiently shorter than the discharge. In many cases, additional transistors or additional gates in multigate transistors must be incorporated to allow the first setting of the voltage levels or to reset the voltage levels after voltage decay. A typical logic gate, using a capacitor level shifter, consists of the capacitor, a load transistor (which is connected to $V_{DD}$) and a network of "active" transistors (see, e.g., FIG. 6A). In order to cause Z to go high, all branches of the active transistor circuit must be made nonconductive. This condition can be achieved by making at least one gate of each dual gate transistor (FIG. 6A) low. This reset function can best be demonstrated by an example, e.g., a frequency divider stage. FIG. 4 shows a typical prior art MESFET stage using Schottky diode level shifting and FIG. 5 shows the logic diagram for the frequency divider.

Figure 4A:
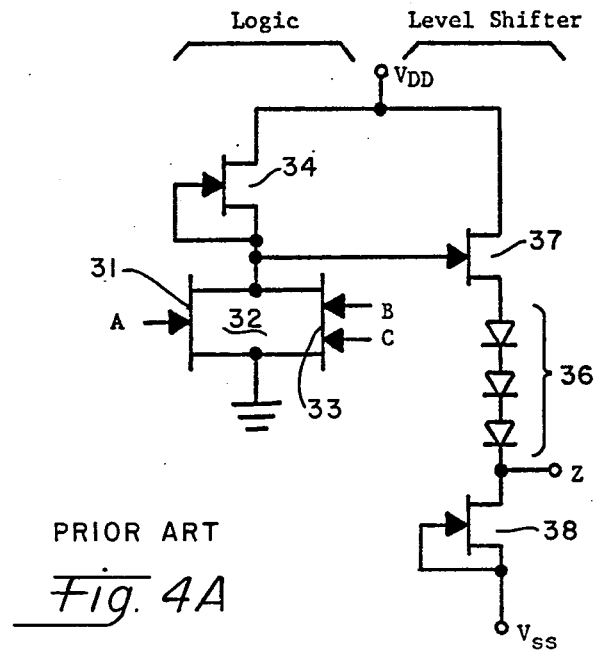
FIG. 4A is a schematic diagram of a prior art MESFET logic gate.

The circuit of FIG. 4A is identical to that of FIG. 1A, except that the active logic element 32 is expanded to include not only the inverter transistor 31, but also a two-gate transistor 33. The equivalent functional block logic diagram of FIG. 4B shows and inverter 31', a NAND gate 33' and an AND gate 35.

Figure 4B:
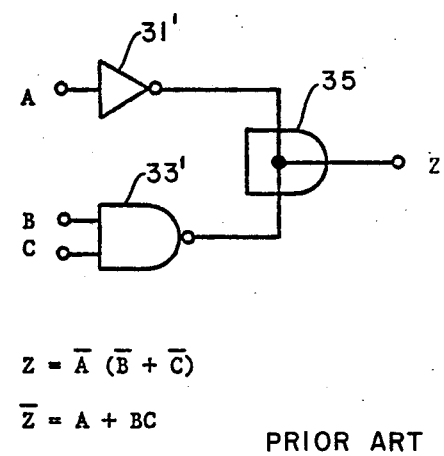
FIG. 4B is an equivalent functional block logic diagram of the circuit.

The frequency divider logic diagram (FIG. 5) shows the binary divider composed of four MESFET logic circuits, each of which is like the stage shown in FIGS. 4A and 4B.

If in the case of the frequency divider of FIG. 5, only the level shifter would be replaced by the capacitor level shifter, the circuit could not be started up. This can be seen as follows: During power on, gate A (FIG. 4) would be in the high level, making Z low. Under this condition, clocking gate C would not affect Z. Hence, the circuit needs to be modified (FIGS. 6 and 7) incorporating a reset gate to a multiple-gate transistor (or incorporating a reset transistor).

Figure 6A:
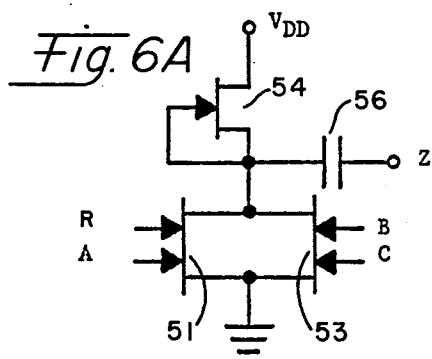
FIG. 6A is a schematic diagram of a dynamic GaAs logic gate according to the invention, where R is used to initiate the circuit or for reset.
Figure 6B:
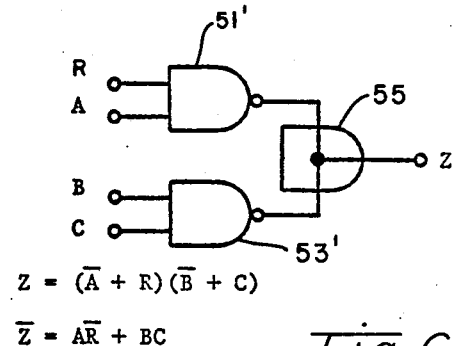
FIG. 6B is an equivalent functional block logic diagram thereof.

The circuit of FIG. 6A is the same as that of FIG. 4A, except that the transistor 31 is replaced by a two-gate transistor 51 to provide the reset gate. The functional block diagram of FIG. 6B now comprises two NAND gates 51' and 53' followed by an AND gate 55. The frequency divider using four stages of FIGS. 6A and 6B, is shown in FIG. 7. The reset lead is connected to the reset input of each of the four stages.

With this reset capability, the divider can be started up and be reinitiated if necessary at certain times. During start up, first $V_{DD}$ is applied and then reset is held low for at least one clock cycle. With reset and clock (input C) low, Z will go high and thereby adjust its dc voltage. When reset is put high, the circuit is in its operating condition. If the clocking frequency is sufficiently high, no further reset is required. The lowest possible clock frequency is determined by the leakage current and by the capacitances used. In cases where parts of the circuits are continuously cycled at sufficiently high frequencies while other parts have to operate to dc level, circuits containing both the disclosed capacitor level shifting as well as Schottky diode level shifting can be used on the same chip.

The capacitor level shifter can be applied not only to MESFET circuits but is also applicable to JFET circuits.

Well established fabrication technologies can be utilized. The preferred implementation uses GaAs depletion mode technology, as described by Rory L. Van Tuyl and Charles A. Liechti, High Speed GaAs MSI, Digest of Technical Papers, 1976 IEEE International Solid State Circuits Conference, paper WAM 1.5, page 20, Capacitors have been fabricated on integrated circuits and no new technology is needed (e.g., see George Gibbons, Solid State Faces New Questions, MSN9, (Microwave Systems New Journal, Vol. 9, No. 13), pages 15–35, December, 1979).

Thus, while preferred constructional features of the invention are embodied in the structure illustrated herein, it is to be understood that changes and variations may be made by the skilled in the art without departing from the spirit and scope of my invention.

I claim:

1. A circuit having an inverting logic stage, comprised of FET devices, which includes a load device connected between a dc bias supply and a junction point, logic means connected between said junction point and a reference point, voltage level shift means connected between said junction point and an output of said inverting logic stage, a next stage having an input, with an FET device having a Schottky barrier between said input and the reference point, and a connection from said output of the inverting logic stage to said input of the next stage;

the improvement wherein said voltage level shift means comprises: a capacitor connected between said junction point of said FET inverting logic stage and said Schottky barrier input of the next stage FET device, in an overall dynamic logic circuit in which said capacitor is self-biased only by active logic signals having a period which is insignificant relative to the capacitor discharge time.

2. A circuit according to claim 1, wherein the FET devices are part of gallium arsenide (GaAs) integrated circuit chip means, wherein in said inverting logic stage said load device is a load FET device having a source and a gate both connected to said junction point and a drain connected to said dc bias supply; and said logic means includes at least one active FET device having a source connected to said reference point, at least one gate serving as an input, and a drain connected to said junction point.

3. A circuit according to claim 2 wherein said logic means of said inverting logic means comprises a plurality of active FET devices, with at least one of the active FET devices having more than one gate and wherein said overall dynamic logic circuit includes a reset or initiate means in which during an initial cycle at least one gate is made low of each active FET device having more than one gate.

4. A frequency divider comprising four FET inverting logic stages, as part of a gallium arsenide integrated circuit chip;

wherein each of said stages comprises a load FET device having a source and a gate both connected to a junction point and a drain connected to a dc bias supply; and logic means comprising two active FET devices, each having a source connected to a reference point, a drain connected to said junction point, and two gates which are Schottky barrier inputs, and a voltage level shift capacitor connected between said junction point and the output of the stage, said capacitor being self biased only by active logic signals having a period which is insignificant relative to the capacitor discharge time;

two stages being cross coupled to form a first bistable device, and the other two stages being also cross coupled to form a second bistable device, with each bistable device having each output connected to an input of the other bistable device, one gate of each stage of the first bistable device being connected to a clock lead, one gate of each stage of the second bistable device being connected to an inverted-clock lead, and one FET device of each of the four stages having one gate connected to a reset lead, so that each stage has one FET device with a gate connected to a clock or inverted-clock lead and its other FET device has a gate connected to the reset lead, the signal on the reset lead being held low for at least one clock cycle to initiate the operation of the frequency divider.

5. A circuit according to claims 1, 2, 3 or 4 in which said FET devices are all depletion mode MESFET devices.

* * * * *